(12) United States Patent
Sun et al.

(10) Patent No.: US 9,859,304 B2
(45) Date of Patent: Jan. 2, 2018

(54) MANUFACTURING METHOD OF ARRAY SUBSTRATE, ARRAY SUBSTRATE AND DISPLAY DEVICE

(71) Applicant: BOE TECHNOLOGY GROUP CO., LTD., Beijing (CN)

(72) Inventors: Shuang Sun, Beijing (CN); Fangzhen Zhang, Beijing (CN); Jing Niu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 20 days.

(21) Appl. No.: 14/436,995

(22) PCT Filed: Aug. 20, 2014

(86) PCT No.: PCT/CN2014/084819
§ 371 (c)(1),
(2) Date: Apr. 20, 2015

(87) PCT Pub. No.: WO2015/149469
PCT Pub. Date: Oct. 8, 2015

(65) Prior Publication Data
US 2016/0148954 A1    May 26, 2016

(30) Foreign Application Priority Data

Apr. 1, 2014    (CN) .......................... 2014 1 0129376

(51) Int. Cl.
*H01L 21/44*    (2006.01)
*H01L 27/12*    (2006.01)
(Continued)

(52) U.S. Cl.
CPC ........ *H01L 27/1222* (2013.01); *G02F 1/1339* (2013.01); *G02F 1/1368* (2013.01);
(Continued)

(58) Field of Classification Search
None
See application file for complete search history.

(56) References Cited

U.S. PATENT DOCUMENTS 8,603,914 B2 * 12/2013 Song ................. G02F 1/134363
349/143
2004/0051823 A1 * 3/2004 Choi ..................... G02F 1/1368
349/43
(Continued)

FOREIGN PATENT DOCUMENTS

CN    101105615 A    1/2008
CN    102637636 A    8/2012
(Continued)

OTHER PUBLICATIONS

First Office Action dated Jan. 20, 2016 corresponding to Chinese application No. 201410129376.2.
(Continued)

*Primary Examiner* — Ali Naraghi
(74) *Attorney, Agent, or Firm* — Nath, Goldberg & Meyer; Joshua B. Goldberg (57) ABSTRACT

The present invention provides an array substrate and a manufacturing method thereof and a display device. The manufacturing method comprises: forming a pattern including a pixel electrode and a source of a thin film transistor on a base substrate through a single patterning process, the pixel electrode is provided in a layer under a layer in which the source is located; forming a pattern including a drain, an active layer, a gate insulation layer and a gate of the thin film transistor through a single patterning process, the active layer covers the source and the drain, and is separated from the gate through the gate insulation layer; and forming a pattern including a passivation layer, a common electrode and a gate line through a single patterning process, the (Continued)

common electrode is a slit electrode and separated from the active layer and the pixel electrode through the passivation layer.

6 Claims, 10 Drawing Sheets

(51) Int. Cl.
| | |
|---|---|
| G02F 1/1339 | (2006.01) |
| G02F 1/1343 | (2006.01) |
| G02F 1/1362 | (2006.01) |
| G02F 1/1368 | (2006.01) |
| H01L 21/027 | (2006.01) |
| H01L 21/3213 | (2006.01) |
| H01L 21/4763 | (2006.01) |
| H01L 29/66 | (2006.01) |
| H01L 29/786 | (2006.01) |

(52) U.S. Cl.
CPC .... *G02F 1/13439* (2013.01); *G02F 1/134336* (2013.01); *G02F 1/136286* (2013.01); *H01L 21/0273* (2013.01); *H01L 21/32134* (2013.01); *H01L 21/32139* (2013.01); *H01L 21/47635* (2013.01); *H01L 27/124* (2013.01); *H01L 27/127* (2013.01); *H01L 27/1225* (2013.01); *H01L 27/1288* (2013.01); *H01L 29/6675* (2013.01); *H01L 29/66969* (2013.01); *H01L 29/7869* (2013.01); *H01L 29/78663* (2013.01); *H01L 29/78672* (2013.01); *G02F 2001/13685* (2013.01); *G02F 2001/134372* (2013.01); *G02F 2001/136231* (2013.01)

(56) References Cited

U.S. PATENT DOCUMENTS

| | | | |
|---|---|---|---|
| 2007/0109455 A1 | 5/2007 | Kim et al. | |
| 2007/0296901 A1* | 12/2007 | Seo | G02F 1/134363 349/141 |
| 2008/0213472 A1* | 9/2008 | Song | G02F 1/134363 427/162 |
| 2013/0099241 A1* | 4/2013 | Chun | G02F 1/136213 257/59 |
| 2013/0203196 A1* | 8/2013 | Qin | H01L 27/124 438/34 |
| 2014/0091331 A1* | 4/2014 | Ning | H01L 27/1288 257/88 |

FOREIGN PATENT DOCUMENTS

| | | |
|---|---|---|
| CN | 103413784 A | 11/2013 |
| CN | 203870365 U | 10/2014 |

OTHER PUBLICATIONS

Second Office Action dated Mar. 23, 2016 corresponding to Chinese application No. 201410129376.2.

* cited by examiner

MANUFACTURING METHOD OF ARRAY SUBSTRATE, ARRAY SUBSTRATE AND DISPLAY DEVICE

This is a National Phase Application filed under 35 U.S.C. 371 as a national stage of PCT/CN2014/084819 filed on Aug. 20, 2014, an application claiming the benefit to Chinese application No. 201410129376.2 filed on Apr. 1, 2014; the content of each of which is hereby incorporated by reference in its entirety.

FIELD OF THE INVENTION

The invention relates to the technical field of manufacturing display device, and particularly to a manufacturing method of an array substrate, an array substrate and a display device.

BACKGROUND OF THE INVENTION

Thin Film Transistor Liquid Crystal Display (TFT-LCD) is an important flat panel display apparatus, and may be classified into a vertical electric field mode TFT-LCD and a horizontal electric field mode TFT-LCD according to the direction of electric field for driving the liquid crystal. The vertical electric field mode TFT-LCD requires to form a pixel electrode on an array substrate, and form a common electrode on a color filter substrate, for example a conventional TN mode TFT-LCD; and the horizontal electric field mode TFT-LCD requires to simultaneously form a pixel electrode and a common electrode on an array substrate, for example an ADS (Advanced Super Dimension Switch) mode TFT-LCD. ADSDS (ADS for short) is a general term for a core technology representing a wide view angle technology which is independently innovated by BOE. ADS refers to a core technology of plane electric field wide view angle-Advanced Super Dimension Switch, and the core technical characteristics are as follows: a multi-dimensional electric field is formed through an electric field generated at edges of slit electrodes in a plane and an electric field generated between the slit electrode layer and a plate electrode layer, so that liquid crystal molecules with all orientations between the slit electrodes and directly above the electrodes can rotate, thus the efficiency of the liquid crystal is enhanced and the transmittance efficiency is also increased. ADS technology can improve the image quality of TFT-LCD product, and has advantages such as high resolution, high transmissivity, low power consumption, wide view angle, high aperture ratio, low chromatic aberration and no push Mura. For various applications, modifications of ADS technology include a high transmissivity I-ADS technology, a high aperture ratio H-ADS technology and a high resolution S-ADS technology and the like.

Figure 1:
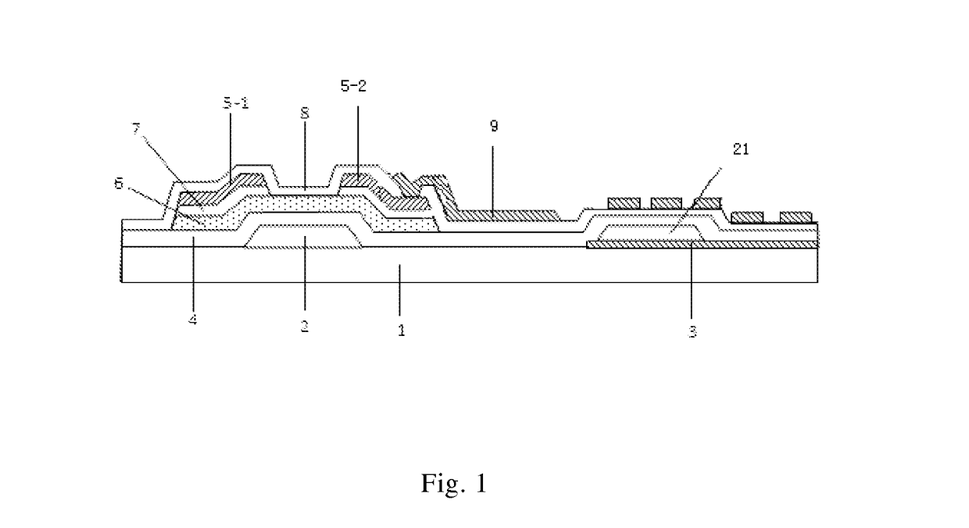
FIG. 1 is a structural diagram of an existing array substrate.

FIG. 1 shows a structural diagram of a bottom gate type array substrate in a conventional ADS mode, and the array substrate may be manufactured through the following steps: forming a pattern including a common electrode 3 on a base substrate through a patterning process; forming a pattern including a gate 2 of a thin film transistor and a gate line 21 on the base substrate 1 subjected to the above step through a patterning process; forming a gate insulation layer 4 on the base substrate 1 subjected to the above step; forming a pattern including an active layer 6 on the base substrate 1 subjected to the above step through a patterning process; on the base substrate 1 subjected to the above step, forming an etch stop layer 7 and forming a source-drain contact region; on the base substrate 1 subjected to the above step, forming a pattern including a source 5-1, a drain 5-2 and a data line through a patterning process, wherein the source 5-1 and the drain 5-2 contact the active layer; forming a passivation layer 8 on the base substrate 1 subjected to the above step; and forming a pattern including a pixel electrode 9 on the base substrate 1 subjected to the above step through a patterning process. In manufacturing the ADS mode array substrate, the above five mask processes are generally used. However, the inventor finds that, as the mask is expensive, in manufacturing the array substrate by using five mask processes, the manufacturing procedure is complex and the cost is high.

SUMMARY OF THE INVENTION

In view of the above problem of high manufacturing cost of the existing array substrate, an object of the invention is to provide a manufacturing method of an array substrate, an array substrate and a display device, which are easy to be implemented and low in cost.

A solution adopted to solve the above technical problem is a manufacturing method of an array substrate comprising:

forming a pattern including a pixel electrode and a source of a thin film transistor on a base substrate through a single patterning process, wherein the pixel electrode is provided in a layer under a layer in which the source is located;

on the base substrate subjected to the above step, forming a pattern including a drain, an active layer, a gate insulation layer and a gate of the thin film transistor through a single patterning process, wherein the active layer covers the source and the drain, and is separated from the gate through the gate insulation layer; and on the base substrate subjected to the above step, forming a pattern including a passivation layer, a common electrode and a gate line through a single patterning process, wherein the common electrode is a slit electrode and separated from the active layer and the pixel electrode through the passivation layer.

In the manufacturing method of an array substrate in the present invention, only three mask plates are used, and therefore the manufacturing cost is largely reduced, the production efficiency is increased and the adaptability is enhanced.

Preferably, the step of forming a pattern including a pixel electrode and a source of a thin film transistor on a base substrate through a single patterning process comprises:

sequentially forming a first transparent conductive film and a source-drain metal film on the base substrate;

applying a first photoresist layer on the base substrate subjected to the above step, performing exposure on the first photoresist layer to form a first photoresist retaining region and a first photoresist removing region, performing development to completely remove the photoresist in the first photoresist removing region and completely retain the photoresist in the first photoresist retaining region;

performing a wet etching on the base substrate subjected to the above step to remove the source-drain metal film and the first transparent conductive film in the first photoresist removing region; and peeling off the remained photoresist on the base substrate subjected to the above step to form a pattern including a data line and form the remained source-drain metal film above the pixel electrode while the pattern including the pixel electrode and the source of the thin film transistor is formed.

Preferably, the step of forming a pattern including a drain, an active layer, a gate insulation layer and a gate of the thin film transistor through a single patterning process comprises:

on the base substrate on which the pixel electrode, the source of the thin film transistor, the data line, and the remained source-drain metal film above the pixel electrode are formed, sequentially forming an active layer film, a gate insulation layer film and a gate metal film;

applying a second photoresist layer on the base substrate subjected to the above step, performing exposure on the second photoresist layer to form a second photoresist retaining region and a second photoresist removing region, performing development to completely remove the photoresist in the second photoresist removing region and completely retain the photoresist in the second photoresist retaining region;

on the base substrate subjected to the above step, performing a wet etching to remove the gate metal film in the second photoresist removing region, performing a dry etching to remove the gate insulation layer film in the second photoresist removing region, and performing a wet etching to remove the active layer film and the remained source-drain metal layer film in the second photoresist removing region; and peeling off the remained photoresist on the base substrate subjected to the above step to form the pattern including the drain, the active layer, the gate insulation layer and the gate of the thin film transistor, and the remained gate metal film, the remained gate insulation layer film and the remained active layer film above the data line.

Further preferably, the step of forming a pattern including a passivation layer, a common electrode and a gate line through a single patterning process comprises:

on the base substrate on which the drain, the active layer, the gate insulation layer and the gate of the thin film transistor and the data line are formed, sequentially forming a passivation layer film and a second transparent conductive film;

applying a third photoresist layer on the base substrate subjected to the above step, performing exposure on the third photoresist layer to form a third photoresist retaining region and a third photoresist removing region, performing development to completely remove the photoresist in the third photoresist removing region and completely retain the photoresist in the third photoresist retaining region;

on the base substrate subjected to the above step, performing a wet etching to remove the second transparent conductive film in the third photoresist removing region, performing a dry etching to remove the passivation layer film in the third photoresist removing region, and performing a wet etching to remove the remained gate metal film in the third photoresist removing region, performing a dry etching to remove the remained gate insulation layer film in the third photoresist removing region, and performing a wet etching to remove the remained active layer film in the third photoresist removing region; and peeling off the remained photoresist on the base substrate subjected to the above step to form the pattern including the passivation layer, the common electrode and the gate line.

Further preferably, the step of forming a gate line through a patterning process comprises:

forming a spacer with the remained gate metal film above the data line to form a pattern of the gate line separated from the remained gate metal film above the data line.

Preferably, the active layer is made of any one of metal oxide, amorphous silicon and polycrystalline silicon.

Further preferably, the metal oxide is any one of indium tin oxide, indium gallium tin oxide, indium zinc oxide and aluminum zinc oxide.

A solution adopted to solve the above technical problem is an array substrate comprising a pixel electrode, a common electrode and a thin film transistor, wherein a first transparent conductive layer is provided under a source and a drain of the thin film transistor and overlaps the source and the drain of the thin film transistor, the pixel electrode is provided under a layer in which the source and the drain of the thin film transistor are located, the first transparent conductive layer under the drain and the pixel electrode are integrated, an active layer of the thin film transistor covers the source and the drain, and is separated from the gate of the thin film transistor through a gate insulation layer, a pssivation layer is provided above the gate and the pixel electrode, and the common electrode is provided above the passivation layer, wherein a pattern of the active layer of the thin film transistor is the same as those of the gate insulation layer and the gate, and a pattern of the passivation layer is the same as that of the common electrode.

Preferably, the array substrate further comprises gate lines and data lines, the gate line is connected to the gate of the thin film transistor, the data line is connected to the source of the thin film transistor, wherein the gate line comprises a gate line body and a protrusion portion provided above the data line and integrated with the gate line body, and the protrusion portions of the gate lines are separated from each other through spacers.

Preferably, the thin film transistor is any one of a metal oxide thin film transistor, an amorphous silicon thin film transistor and a polycrystalline silicon thin film transistor.

A solution adopted to solve the above technical problem is a display device comprising the above array substrate.

reference signs: 1—base substrate; 2—gate; 21—gate line; 20—gate metal film; 3—common electrode; 30—second transparent conductive film; 4—gate insulation layer; 40—gate insulation layer film; 5-1—source; 5-2—drain; 50—source-drain metal film; 6—active layer; 60—active layer film; 7—etch stop layer; 8—passivation layer; 80—passivation layer film; 9—pixel electrode; 90—first transparent conductive film; 201—spacer; 101—first photoresist layer; 102—second photoresist layer; and 103—third photoresist layer.

DETAILED DESCRIPTION OF THE EMBODIMENTS

In order to make persons skilled in the art better understand solutions of the present invention, the present invention will be further described in detail below in conjunction with the drawings and embodiments.

Embodiment 1

Figure 2:
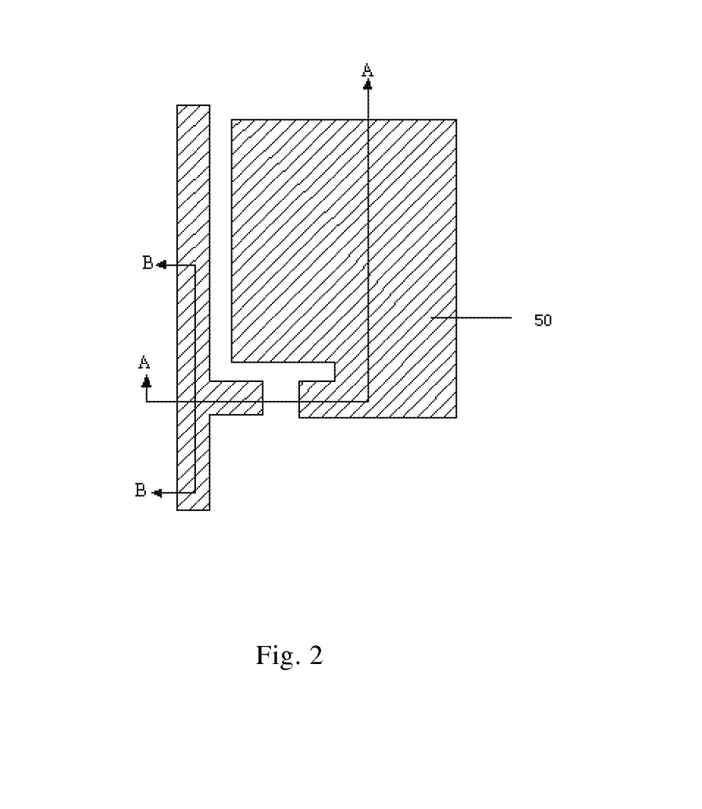
FIG. 2 is a diagram of a structure obtained after a first patterning process in a manufacturing method of an array substrate according to a first embodiment 1 of the present invention is performed.
Figure 3:
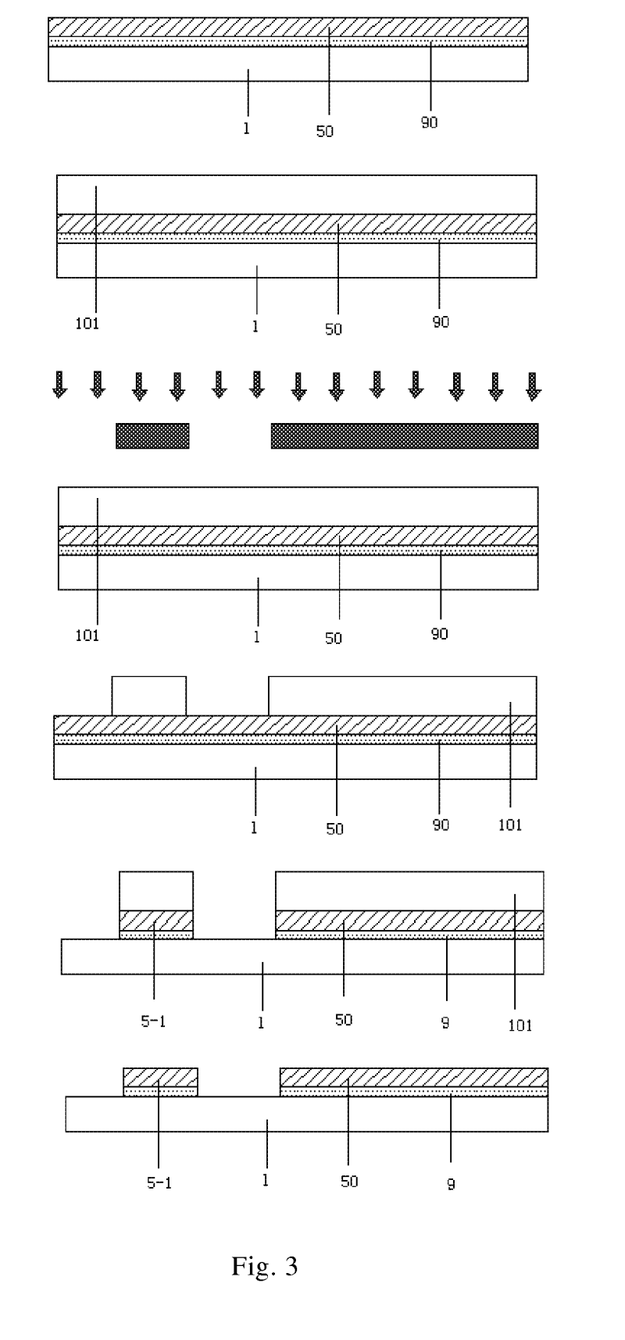
FIG. 3 is a process flow diagram of the first patterning process along A-A direction in FIG. 2.
Figure 4:
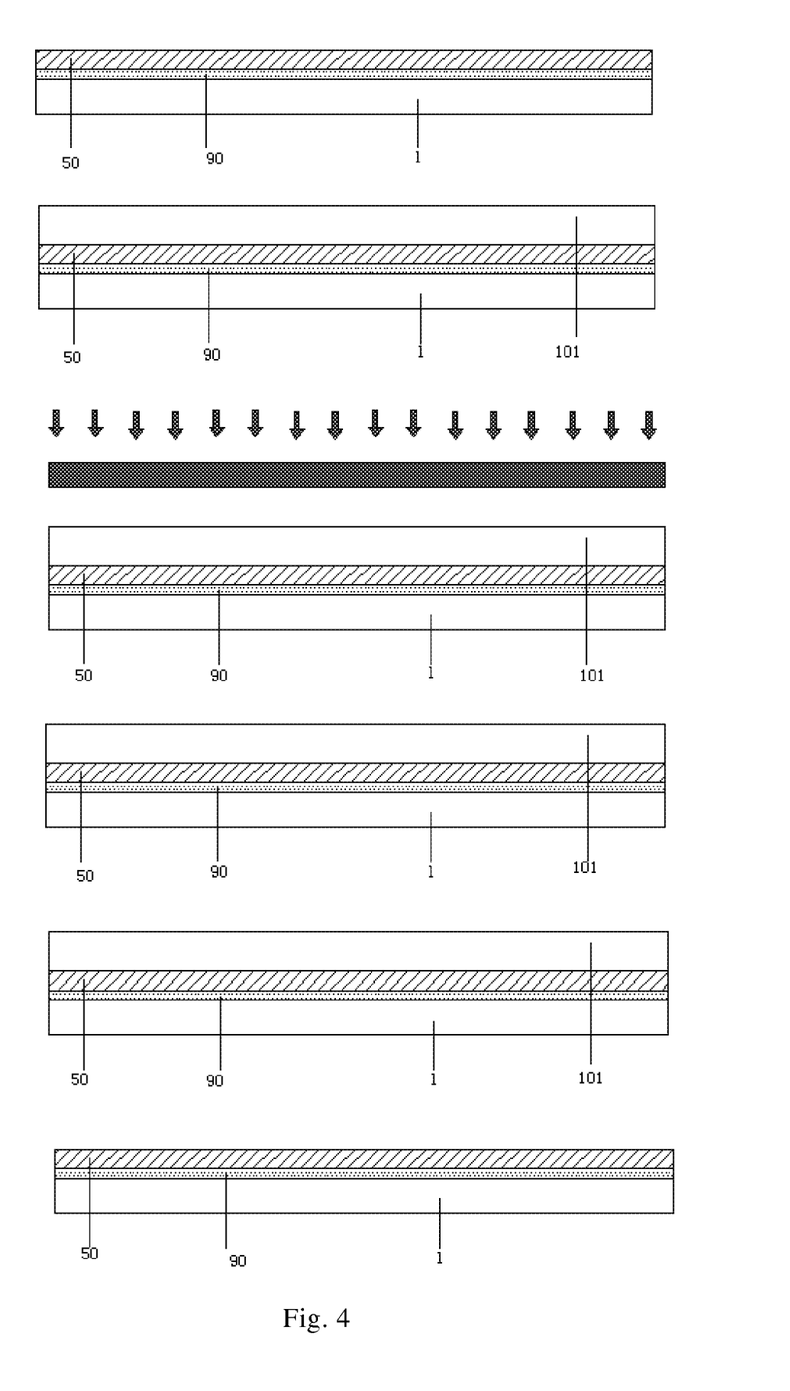
FIG. 4 is a process flow diagram of the first patterning process along B-B direction in FIG. 2.

As shown in FIG. 2 to FIG. 10, the present embodiment provides a manufacturing method of an array substrate, which specifically comprises following steps:

step 1, with reference to FIG. 2 to FIG. 4, forming a pattern including a pixel electrode 9 and a source 5-1 of a thin film transistor on a base substrate 1 through a patterning process, wherein the pixel electrode 9 is provided in a layer below a layer in which the source 5-1 is located.

It should be noted that, the base substrate 1 may refer to a substrate without any film formed thereon, such as a white glass, and may also refer to a substrate with other film or pattern formed thereon, such as a substrate formed with a buffer layer. The patterning process generally includes processes such as applying photoresist, exposure, development, etching, peeling off photoresist. As shown in FIG. 3 and FIG. 4, the above step may specifically comprise following steps of:

S101, sequentially forming a first transparent conductive film 90 and a source-drain metal film 50 on the base substrate 1 by a magnetron sputtering method or a thermal evaporation method.

The thickness of the first transparent conductive film 90 is between 100~1000 Å, and the thickness of the source-drain metal film 50 is between 1000~6000 Å. The first transparent conductive film 90 may be made of indium tin oxide (ITO), indium zinc oxide (IZO) or aluminum zinc oxide etc. The source-drain metal film 50 may be made of metal such as molybdenum, aluminum, alloy of aluminum and nickel, alloy of molybdenum and tungsten, chromium or copper, or may be of a composite structure made of several of the above materials. Of course, the thicknesses and the materials of the first transparent conductive film 90 and the source-drain metal film 50 may be set as desired.

S102, applying a first photoresist layer 101 on the base substrate 1 subjected to the above step, performing exposure on the photoresist to form a first photoresist retaining region and a first photoresist removing region, performing development to completely remove the photoresist in the first photoresist removing region and completely retain the photoresist in the first photoresist retaining region.

S103, performing a wet etching on the base substrate 1 subjected to the above step to remove the source-drain metal film 50 and the first transparent conductive film 90 in the first photoresist removing region.

S104, peeling off the remained photoresist on the base substrate 1 subjected to the above step to form a pattern including the pixel electrode 9, the source 5-1 of the thin film transistor and a data line, and form the remained source-drain metal film above the pixel electrode 9.

Figure 5:
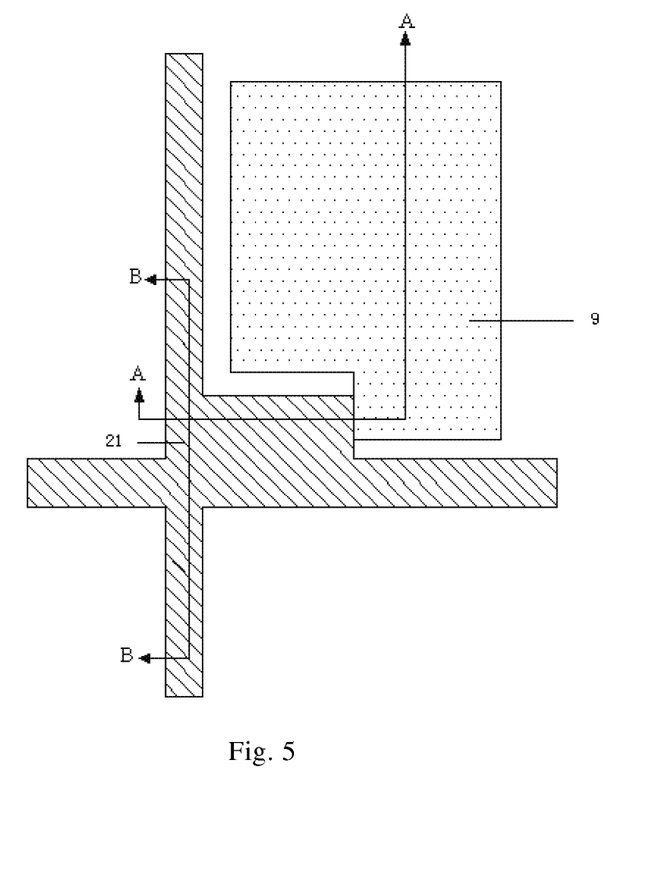
FIG. 5 is a diagram of a structure obtained after a second patterning process of the manufacturing method of an array substrate according to the first embodiment 1 of the present invention is performed.
Figure 6:
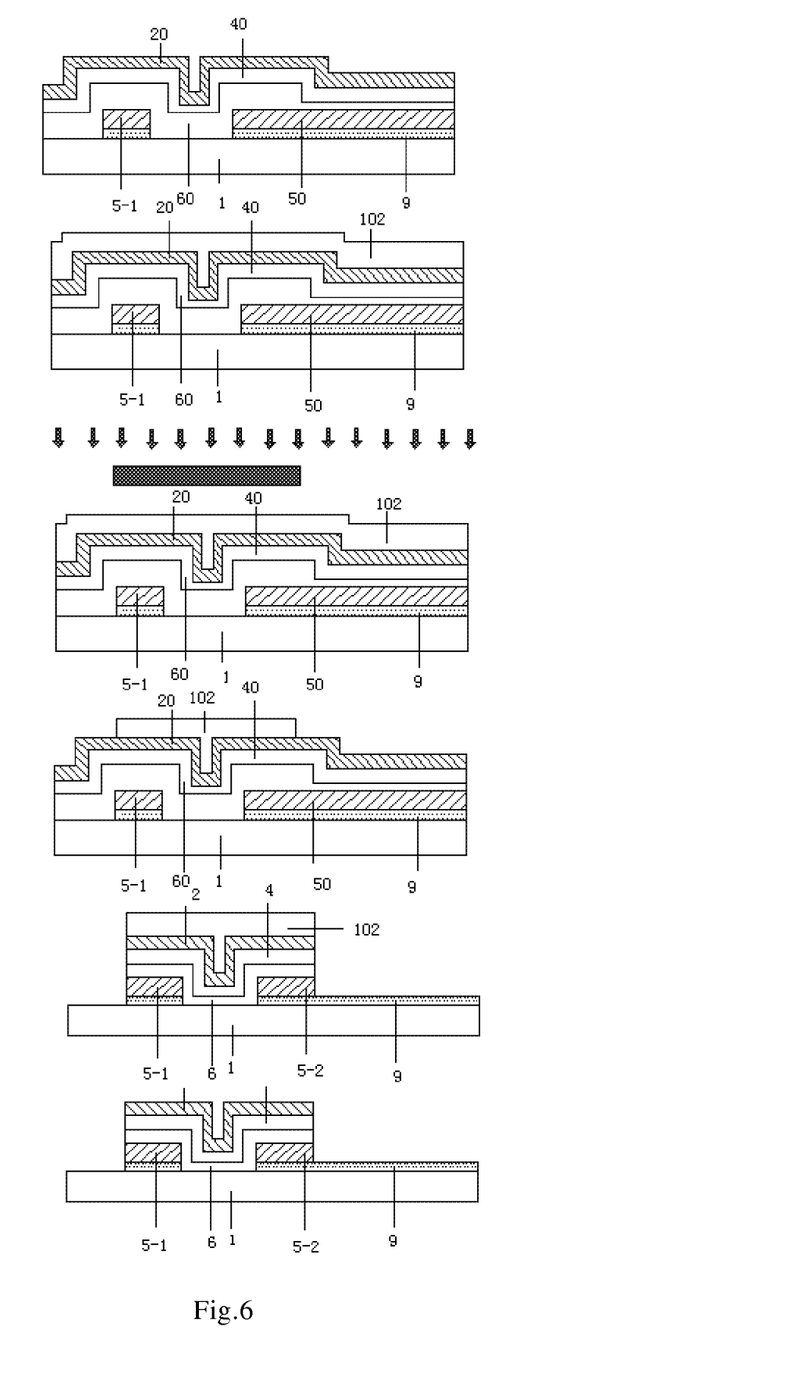
FIG. 6 is a process flow diagram of the second patterning process along A-A direction in FIG. 5.
Figure 7:
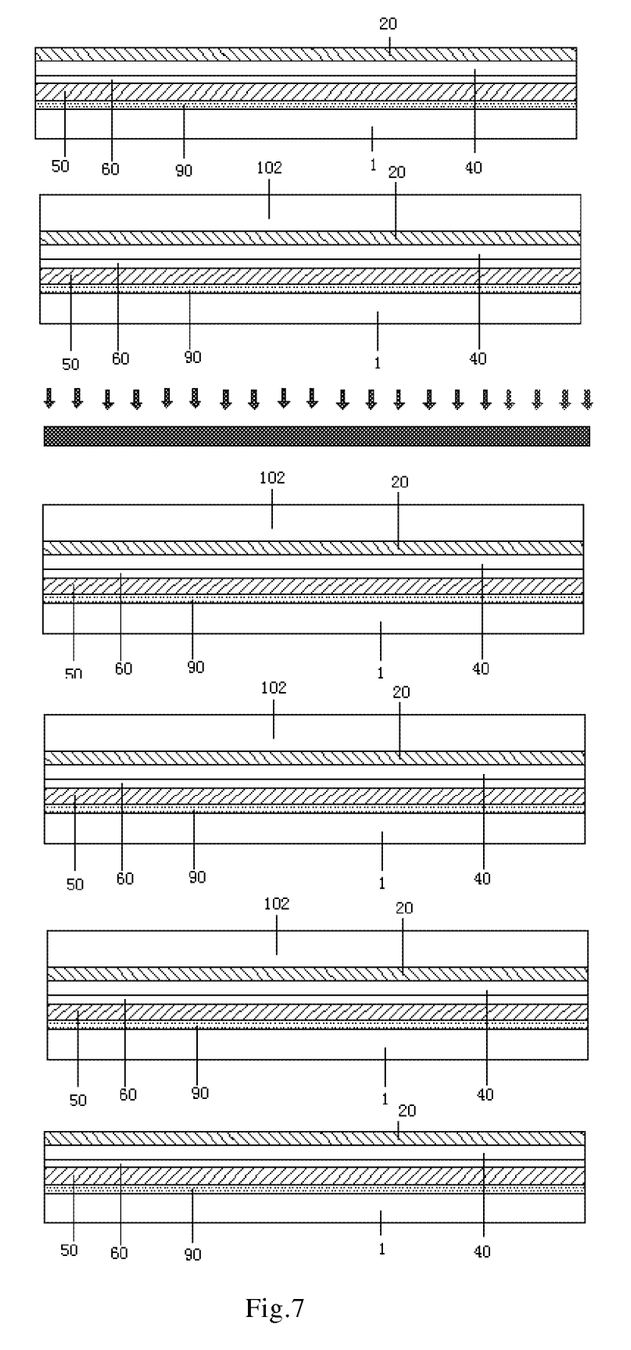
FIG. 7 is a process flow diagram of the second patterning process along B-B direction in FIG. 5.

Step 2, with reference to FIG. 5 to FIG. 7, on the base substrate 1 subjected to the above step, forming a pattern including a drain 5-2, an active layer 6, a gate insulation layer 4 and a gate 2 of the thin film transistor through a single patterning process, wherein the active layer 6 covers the source 5-1 and the drain 5-2, and is spaced from the gate 2 through the gate insulation layer 4.

As shown in FIG. 6 and FIG. 7, the step 2 may specifically comprise:

S201, on the base substrate 1 on which the pixel electrode 9, the source 5-1 of the thin film transistor and the remained source-drain metal film above the pixel electrode are formed, forming an active layer film 60 by using a magnetron sputtering method or a thermal evaporation method, next forming a gate insulation layer film by using a chemical vapor deposition method, and then forming a gate metal film 20 by using a magnetron sputtering method or a thermal evaporation method.

The thickness of the gate metal film 20 is between 1000~6000 Å. The active layer film 60 may be made of any one of metal oxide, amorphous silicon and polycrystalline silicon, or made of other semiconductor material. Furthermore, the metal oxide is preferably any one of indium tin oxide, indium gallium tin oxide, indium zinc oxide and aluminum zinc oxide. The gate insulation layer film 40 may be made of an insulation material such as oxide, nitride or oxynitride. The gate metal film 20 may be made of metal such as molybdenum, aluminum, alloy of aluminum and nickel, alloy of molybdenum and tungsten, chromium or copper, or may be of a composite structure made of several of the above materials.

S202, applying a second photoresist layer 102 on the base substrate 1 subjected to the above step, performing exposure on the photoresist to form a second photoresist retaining region and a second photoresist removing region, performing development to completely remove the photoresist in the second photoresist removing region and completely retain the photoresist in the second photoresist retaining region;

S203, on the base substrate 1 subjected to the above step, performing a wet etching to remove the gate metal film 20 in the second photoresist removing region, performing a dry etching to remove the gate insulation layer film 40 in the second photoresist removing region, and performing a wet etching to remove the active layer film 60 and the remained source-drain metal layer film in the second photoresist removing region.

S204, peeling off the remained photoresist on the base substrate 1 subjected to the above step to form a pattern including the drain 5-2, the active layer 6, the gate insulation layer 4 and the gate 2 of the thin film transistor, and the remained gate metal film, the remained gate insulation layer film 40 and the remained active layer film 60 above the data line.

Figure 8:
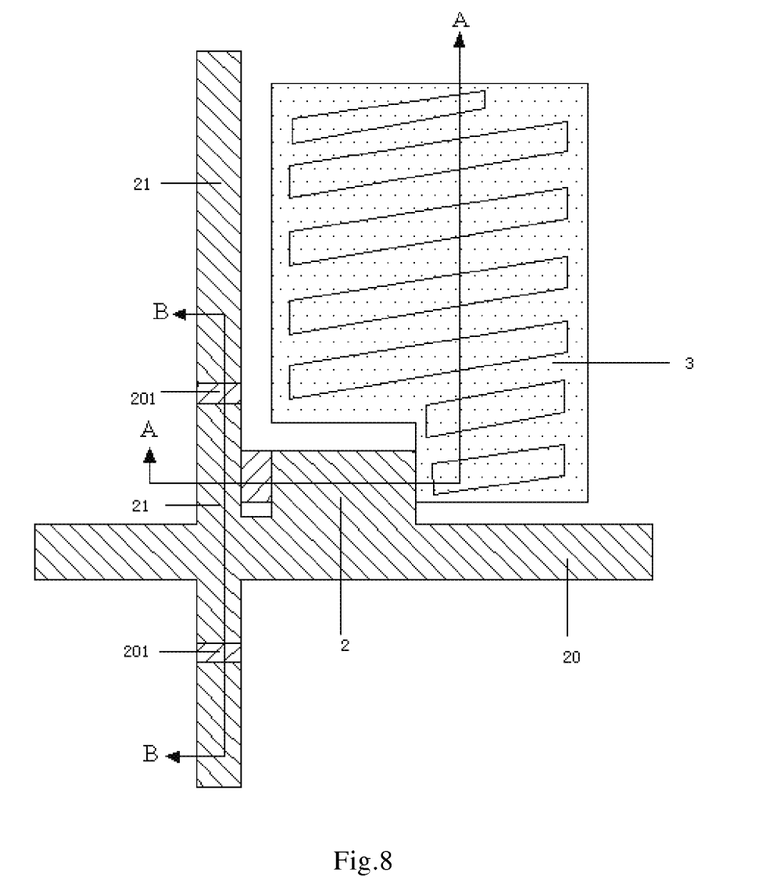
FIG. 8 is a diagram of a structure obtained after a third patterning process in the manufacturing method of an array substrate according to the first embodiment 1 of the present invention is performed.
Figure 9:
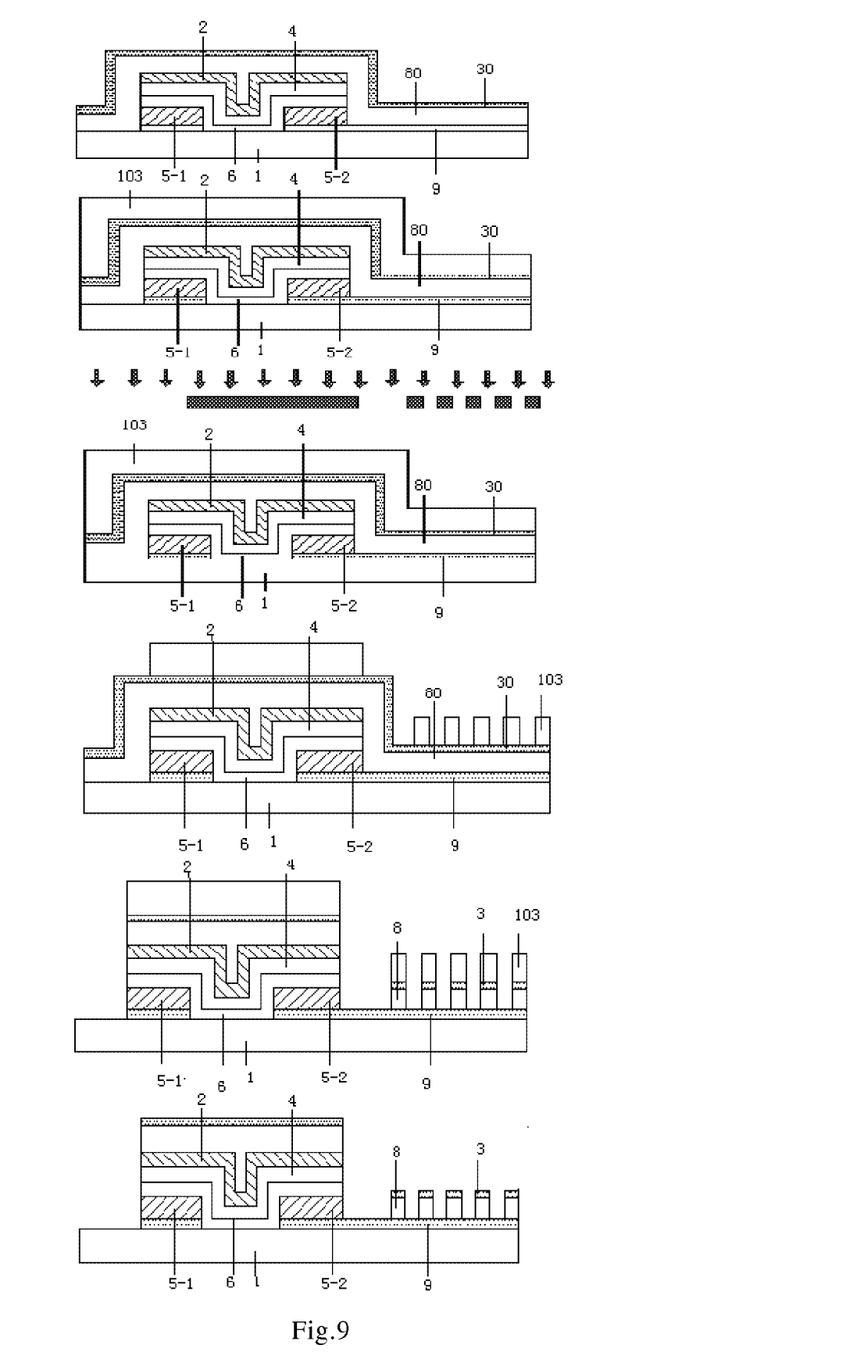
FIG. 9 is a process flow diagram of the third patterning process along A-A direction in FIG. 8.
Figure 10:
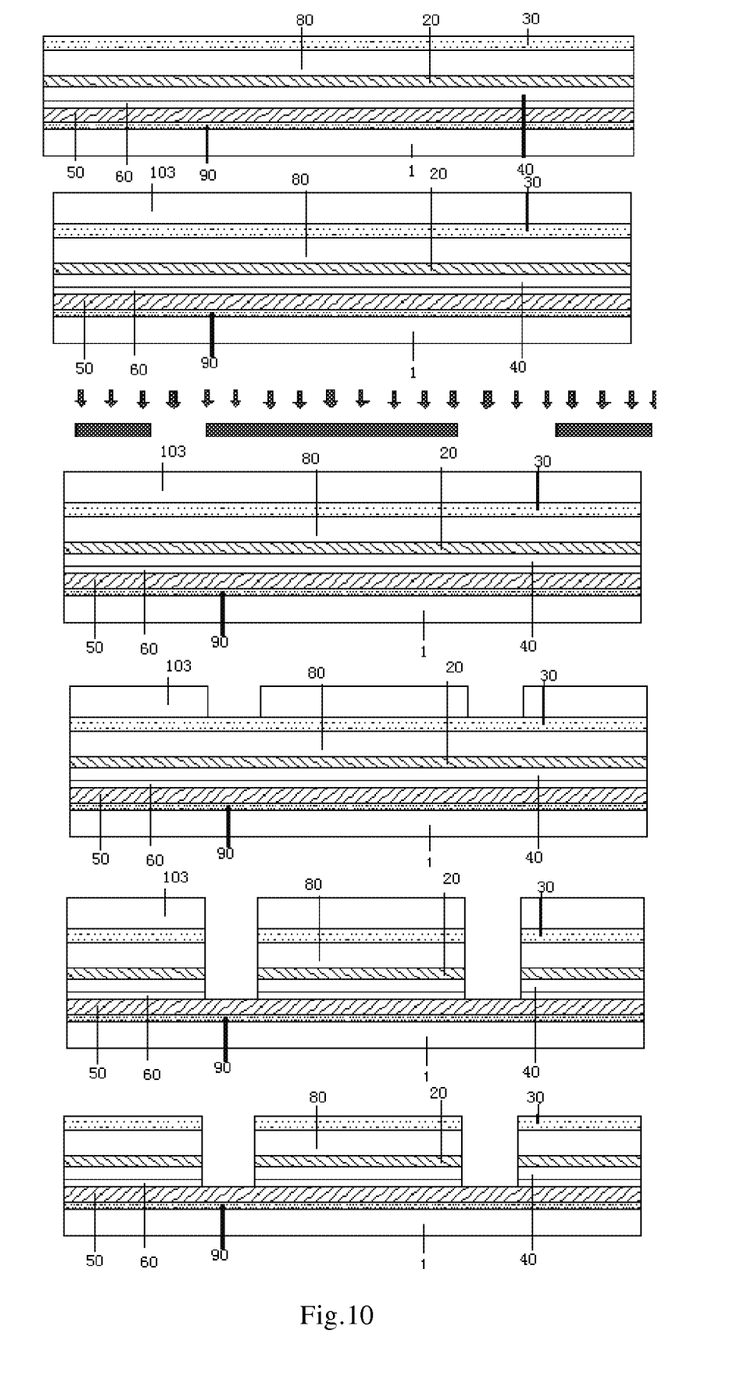
FIG. 10 is a process flow diagram of the third patterning process along B-B direction in FIG. 8.

Step 3, with reference to FIG. 8 to FIG. 10, on the base substrate 1 subjected to the above step, forming a pattern including a passivation layer 8, a common electrode 3 and a gate line 21 through a single patterning process, wherein the common electrode 3 is a slit electrode and separated from the active layer 6 and the pixel electrode 9 through the passivation layer 8.

As shown in FIG. 9 and FIG. 10, this step specifically comprises:

S301, on the base substrate 1 on which the drain 5-2, the active layer 6, the gate insulation layer 4 and the gate 2 of the thin film transistor and the data line are formed, forming a passivation layer film 80 by using a chemical vapor deposition method, and then forming a second transparent conductive film 30 by using a magnetron sputtering method or a thermal evaporation method.

The thickness of the second transparent conductive film 30 is between 100~1000 Å. The second transparent conductive film 30 is made of indium tin oxide (ITO), indium zinc oxide (IZO) or aluminum zinc oxide etc. The passivation layer film 80 is made of oxide, nitride or oxynitride.

S302, applying a third photoresist layer 103 on the base substrate 1 subjected to the above step, performing exposure on the photoresist to form a third photoresist retaining region and a third photoresist removing region, performing development to completely remove the photoresist in the third photoresist removing region and completely retain the photoresist in the third photoresist retaining region.

S303, on the base substrate 1 subjected to the above step, performing a wet etching to remove the second transparent conductive film 30 in the third photoresist removing region, performing a dry etching to remove the passivation layer film 80 in the third photoresist removing region, and performing a wet etching to remove the remained gate metal film 20 in the third photoresist removing region, performing a dry etching to remove the remained gate insulation layer film 40 in the third photoresist removing region, and performing a wet etching to remove the remained active layer film 60 in the third photoresist removing region.

S304, peeling off the remained photoresist on the base substrate 1 subjected to the above step to form a pattern including the passivation layer 8 and the common electrode 3, and meanwhile, forming spacers 201 at the remained gate metal film above the data line to locate at both sides of the data line, to form a pattern of the broken gate line 21.

With the manufacturing method of an array substrate in the present embodiment, only three mask plates are used, therefore the manufacturing cost is largely reduced, the production efficiency is increased and the adaptability is enhanced.

Embodiment 2

Figure 11:
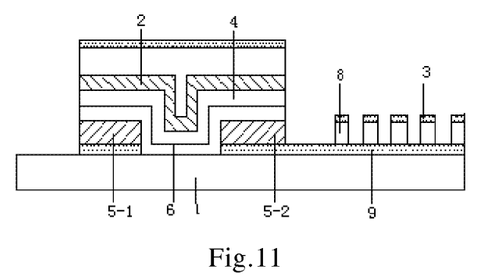
FIG. 11 is a structural diagram of an array substrate according to an embodiment 2 in the present invention.

As shown in FIG. 11, the present embodiment provides an array substrate comprising a pixel electrode 9, a common electrode 9 and a thin film transistor, wherein a first transparent conductive layer is provided under a source 5-1 and a drain 5-2 of the thin film transistor and overlaps the source and the drain of the thin film transistor, the pixel electrode 9 is provided under a layer in which the source 5-1 and the drain 5-2 of the thin film transistor are located, the first transparent conductive layer under the drain 5-2 and the pixel electrode 9 are integrated, an active layer 6 of the thin film transistor covers the source 5-1 and the drain 5-2, and is separated from the gate 2 of the thin film transistor through a gate insulation layer 4, a pssivation layer 8 is provided above the gate 2 and the pixel electrode 9, and the common electrode 3 is provided above the passivation layer 8, wherein a pattern of the active layer 6 of the thin film transistor is the same as those of the gate insulation layer 4 and the gate 2, and a pattern of the passivation layer 8 is the same as that of the common electrode 3.

Certainly, the array substrate of the present embodiment may be manufactured by the manufacturing method in the Embodiment 1, therefore, only three mask plates are used, and thus the manufacturing cost is largely reduced, the production efficiency is increased and the adaptability is enhanced.

The array substrate further comprises gate lines 21 and data lines, the gate line 21 is connected to the gate 2 of the thin film transistor, and the data line is connected to the source 5-1 of the thin film transistor, wherein the gate line 21 comprises a gate line body, and a protrusion portion provided above the data line and integrated with the gate line body, and the protrusion portions of the gate lines are separated from each other through spacers 201.

Preferably, the thin film transistor is any one of metal oxide thin film transistor, amorphous silicon thin film transistor and polycrystalline silicon thin film transistor.

Layers of the array substrate in the present embodiment may be made of the same materials as those in the embodiment 1, which will not be repeated herein.

Embodiment 3

The present embodiment provides a display device, including the above array substrate. The display device may be any product or component which has a display function, such as a mobile phone, a tablet computer, a TV, a monitor, a notebook computer, a digital photo frame, a navigator.

The display device in the present embodiment has the array substrate in the embodiment 2, and therefore its cost is low.

Certainly, the display device in the present embodiment may also include other conventional structures, such as a power supply unit, a display driving unit and the like.

It should be understood that, the above embodiments are just exemplary embodiments employed to describe the principle of the invention, and the invention is not limited thereto. For persons skilled in the art, various variations and improvements can be made without departing from the spirit and scope of the invention, and these variations and improvements should be considered to belong to the protection scope of the invention.

The invention claimed is:

1. A manufacturing method of an array substrate comprising: forming a pattern including a pixel electrode and a source of a thin film transistor on a base substrate through a first single patterning process, wherein the pixel electrode is provided in a layer under another layer in which the source is located;

on the base substrate subjected to the above step, forming a pattern including a drain, an active layer, a gate insulation layer and a gate of the thin film transistor through a second single patterning process, wherein the active layer covers the source and the drain, and is spaced from the gate through the gate insulation layer; and on the base substrate subjected to the above step, forming a pattern including a passivation layer, a common electrode and a gate line through third single patterning process, wherein the common electrode is a slit electrode and spaced from the active layer and the pixel electrode through the passivation layer.

2. The manufacturing method of an array substrate of claim 1, wherein the step of forming a pattern including a pixel electrode and a source of a thin film transistor on a base substrate through a single patterning process comprises:

sequentially forming a first transparent conductive film and a source-drain metal film on the base substrate;

applying a first photoresist layer on the base substrate subjected to the above step, performing an exposure process on the first photoresist layer to form a first photoresist retaining region and a first photoresist removing region, performing a development process to completely remove the photoresist in the first photoresist removing region and completely retain the photoresist in the first photoresist retaining region;

performing a wet etching on the base substrate subjected to the above step to remove the source-drain metal film and the first transparent conductive film in the first photoresist removing region; and peeling off the remained photoresist on the base substrate subjected to the above step to form a pattern including a data line and form the remained source-drain metal film above the pixel electrode while the pattern including the pixel electrode and the source of the thin film transistor is formed.

3. The manufacturing method of an array substrate of claim 2, wherein the step of forming a pattern including a drain, an active layer, a gate insulation layer and a gate of the thin film transistor through a single patterning process comprises:

on the base substrate on which the pixel electrode, the source of the thin film transistor, the data line, and the remained source-drain metal film above the pixel electrode are formed, sequentially forming an active layer film, a gate insulation layer film and a gate metal film;

applying a second photoresist layer on the base substrate on which the active layer film, the gate insulation layer film and the gate metal film are formed, performing an exposure process on the second photoresist layer to form a second photoresist retaining region and a second photoresist removing region, performing a development process to completely remove the photoresist in the second photoresist removing region and completely retain the photoresist in the second photoresist retaining region;

on the base substrate on which the exposure process and the development process have been performed, performing a wet etching to remove the gate metal film in the second photoresist removing region, performing a dry etching to remove the gate insulation layer film in the second photoresist removing region, and performing a wet etching to remove the active layer film and the remained source-drain metal layer film in the second photoresist removing region; and peeling off the remained photoresist on the base substrate on which the wet etching and dry etching have been performed to form the pattern including the drain, the active layer, the gate insulation layer and the gate of the thin film transistor, and the remained gate metal film, the remained gate insulation layer film and the remained active layer film above the data line.

4. The manufacturing method of an array substrate of claim 3, wherein the step of forming a pattern including a passivation layer, a common electrode and a gate line through a single patterning process comprises:

on the base substrate on which the drain, the active layer, the gate insulation layer and the gate of the thin film transistor and the data line are formed, sequentially forming a passivation layer film and a second transparent conductive film;

applying a third photoresist layer on the base substrate on which the passivation layer film and the second transparent conductive film are formed, performing an exposure process on the third photoresist layer to form a third photoresist retaining region and a third photoresist removing region, performing a development process to completely remove the photoresist in the third photoresist removing region and completely retain the photoresist in the third photoresist retaining region;

on the base substrate on which the exposure process and the development process have been performed, performing a wet etching to remove the second transparent conductive film in the third photoresist removing region, performing a dry etching to remove the passivation layer film in the third photoresist removing region, and performing a wet etching to remove the remained gate metal film in the third photoresist removing region, performing a dry etching to remove the remained gate insulation layer film in the third photoresist removing region, and performing a wet etching to remove the remained active layer film in the third photoresist removing region; and peeling off the remained photoresist on the base substrate on which the wet etching and the dry etching have been performed to form the pattern including the passivation layer, the common electrode and the gate line.

5. The manufacturing method of an array substrate of claim 4, wherein the step of forming a gate line through another patterning process comprises:

forming spacers at the remained gate metal film above the data line, to form a pattern of the gate line disconnected with the remained gate metal film above the data line.

6. The manufacturing method of an array substrate of claim 1, wherein the active layer is made of any one of indium tin oxide, indium gallium tin oxide, indium zinc oxide, aluminum zinc oxide, amorphous silicon and polycrystalline silicon.

* * * * *